United States Patent
Yamamoto

(10) Patent No.: US 7,667,254 B2
(45) Date of Patent: Feb. 23, 2010

(54) SEMICONDUCTOR INTEGRATED CIRCUIT DEVICE

(75) Inventor: Hiroshi Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 566 days.

(21) Appl. No.: 11/481,041

(22) Filed: Jul. 6, 2006

(65) Prior Publication Data

US 2007/0013391 A1 Jan. 18, 2007

(30) Foreign Application Priority Data

Jul. 14, 2005 (JP) ............................. 2005-205676

(51) Int. Cl.
*H01L 29/94* (2006.01)

(52) U.S. Cl. ...................... 257/299; 257/207; 257/208; 257/210; 257/494; 257/E29.008; 257/E29.014; 257/E23.079

(58) Field of Classification Search ......... 257/207–211, 257/202–204, 299, 494, 691, 773, 776, E29.008, 257/E29.014, E23.079
See application file for complete search history.

(56) References Cited

U.S. PATENT DOCUMENTS

| 5,539,223 | A | * | 7/1996 | Sugoh et al. ................. 257/207 |
| 6,340,825 | B1 | * | 1/2002 | Shibata et al. ............... 257/207 |
| 2003/0018949 | A1 | | 1/2003 | Yoshida | |

FOREIGN PATENT DOCUMENTS

| JP | 2-51252 | 2/1990 |
| JP | 2003-31664 | 1/2003 |

OTHER PUBLICATIONS

Chinese Office Action dated May 9, 2008 with partial English translation.

* cited by examiner

*Primary Examiner*—Jasmine J Clark
(74) *Attorney, Agent, or Firm*—McGinn IP Law Group PLLC

(57) ABSTRACT

Wiring is routed to assure insulation between wiring traces in a semiconductor integrated circuit device. The device includes a first wiring trace to which a prescribed voltage is supplied; a second wiring trace that takes on a voltage that exceeds the prescribed voltage; and a third wiring trace that only takes on a voltage less than the prescribed voltage. Alternatively, the device includes a first wiring trace to which a prescribed voltage is supplied; a second wiring trace that takes on a voltage less than the prescribed voltage; and a third wiring trace that takes on a voltage equal to or greater than the prescribed voltage. The wiring traces are routed at a certain wiring space in such a manner that the first wiring trace is interposed between the second and third wiring traces. The first wiring trace for which the potential difference is known to be small beforehand is routed so as to always be adjacent to the second wiring trace. Accordingly, the third wiring trace for which there is the possibility that the potential difference relative to the second wiring trace will become large is never placed directly adjacent the second wiring trace. As a result of such routing, wiring is implemented in such a manner that the insulation between traces can be sufficiently assured.

21 Claims, 7 Drawing Sheets

SEMICONDUCTOR INTEGRATED CIRCUIT DEVICE

FIELD OF THE INVENTION

This invention relates to a semiconductor integrated circuit device and, more particularly, to a semiconductor integrated circuit device having wiring for multiple power supplies.

BACKGROUND OF THE INVENTION

Reducing power consumption is of paramount importance in semiconductor integrated circuits employed in mobile telephones and the like. A method of controlling substrate bias is one method of reducing power consumption in semiconductor integrated circuit devices. Substrate bias refers to the application of voltage to a well formed in the substrate of a transistor (namely to the back gate of the transistor). By way of example, when a transistor is operating, a forward substrate bias (which diminishes the potential difference between the gate and back gate) is applied, thereby facilitating the flow of current in the channel of the transistor and speeding up operation. When a transistor is non-operational, on the other hand, a reverse substrate bias (which enlarges the potential difference between the gate and back gate) is applied, thereby diminishing leakage of current and reducing power consumption. Such substrate bias is supplied via substrate-bias control wiring that is laid separate from ordinary power-supply wiring. Further, the wiring for substrate-bias control can take on a potential higher than the power-supply voltage or lower than ground voltage particularly when reverse substrate bias is applied.

An increase in device functionality and versatility has been accompanied by an increase in the degree of integration of semiconductor integrated circuit devices and in the density of wiring in such devices. In already existing routing processes, routing is performed so as to maintain a prescribed minimum spacing. More specifically, in a case where substrate-bias control is not performed, a design method implemented by a design system is carried out to perform routing in such a manner that the minimum necessary wiring spacing will be adopted as the prescribed minimum spacing in order to assure reliability even if the maximum potential difference develops between the power supply and ground. On the other hand, a design method of assuring insulation between wiring traces by causing an automatic routing tool to recognize the potential of each wiring trace and changing the wiring spacing in accordance with the potential difference between traces has been disclosed in Patent Document 1. This method includes inputting net-list data that specifies the potentials of wiring networks and creating wiring layout data based upon wiring spacing that corresponds to the potential difference between networks.

[Patent Document 1] Japanese Patent Kokai Publication No. JP-P2003-31664A

SUMMARY OF THE DISCLOSURE

As mentioned above, the potential difference between adjacent wiring traces is a problem in wiring for controlling substrate bias. That is, the potential of substrate-bias control wiring can become higher than the ordinary power-supply potential or lower than ground potential. When routing is performed at the prescribed minimum spacing, therefore, the potential gradient between wiring traces exceeds a set value in the already existing routing process. In recent semiconductor integrated circuit devices exhibiting much finer patterning, assuring good insulation is difficult and there is the danger of a decline in reliability.

Performing routing upon deciding a minimum spacing d0 between traces so as to assure that sufficient insulation can be achieved regardless of the potential difference between adjacent traces has been considered. Specifically, as illustrated in FIG. 6, routing is performed using a minimum spacing d0 as the spacing between a wiring trace 110 for controlling substrate bias and ordinary wiring traces 111, or between mutually adjacent ordinary wiring traces 111. In this case, owing to excessive spacing between mutually adjacent wiring traces between which the potential difference is small, wiring resources are depleted and there may be an increase in chip size.

On the hand, a method of the kind shown in FIG. 7 is available. According to this method, minimum spacing d1 between traces is set to be smaller than the minimum spacing d0 of FIG. 6 and routing is performed by an automatic routing tool. Then, with regard to a wiring trace 111a for which the potential difference relative to adjacent traces is so high that sufficient insulation cannot be assured, routing (a shift in position, etc.) is performed again manually to assure insulation between traces. In accordance with this method, there is no danger that chip size will be increased owing to an excessively large wiring spacing. A problem which arises, however, is that human intervention is required in the result of routing by the automatic routing tool and there is a great increase in design labor necessary to make revisions.

Further, even with the design method of the above-mentioned Patent Document 1, net-list data that specifies potentials must be prepared and a method of specifying wiring spacing conforming to potential differences is necessary. That is, special design data and a special design environment are required and implementing design is difficult by simple routing using an already existing automatic routing tool. So there is much desired in the art.

SUMMARY OF THE DISCLOSURE

According to a first aspect of the present invention, there is provided a semiconductor integrated circuit device comprising: a first wiring trace to which a prescribed voltage is supplied; a second wiring trace that may take on a voltage that exceeds the prescribed voltage; and a third wiring trace that only takes on a voltage not exceeding the prescribed voltage; the wiring traces being routed in such a manner that the first wiring trace is interposed between the second and third wiring traces in the same wiring layer of the semiconductor integrated circuit device.

According to a second aspect of the present invention, there is provided a semiconductor integrated circuit device comprising: a first wiring trace to which a prescribed voltage is supplied; a second wiring trace that only takes on a voltage equal to or greater than the prescribed voltage; and a third wiring trace that may take on a voltage that falls below the prescribed voltage; the wiring traces being routed in such a manner that the first wiring trace is interposed between the second and third wiring traces in the same wiring layer of the semiconductor integrated circuit device.

According to a third aspect of the present invention, there is provided a semiconductor integrated circuit device comprising: a first wiring trace to which a first voltage is supplied; a second wiring trace to which a second voltage may be supplied; a third wiring trace that only takes on a range of voltages not exceeding the first voltage and equal to or greater than the second voltage; a fourth wiring trace to which a voltage that exceeds the first voltage may be supplied; and a fifth wiring trace to which a voltage that falls below the second voltage may be supplied; the first wiring trace being interposed between the third and fourth wiring traces and the second wiring trace being interposed between the third and fifth wiring traces in the same wiring layer.

The meritorious effects of the present invention are summarized as follows.

In accordance with the present invention, it is possible to perform routing that assures insulation between wiring traces without increasing design labor in the routing operation.

Other objectives, features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

PREFERRED EMBODIMENTS OF THE INVENTION

Preferred embodiments of the present invention will now be described in detail with reference to the drawings.

Figure 1:
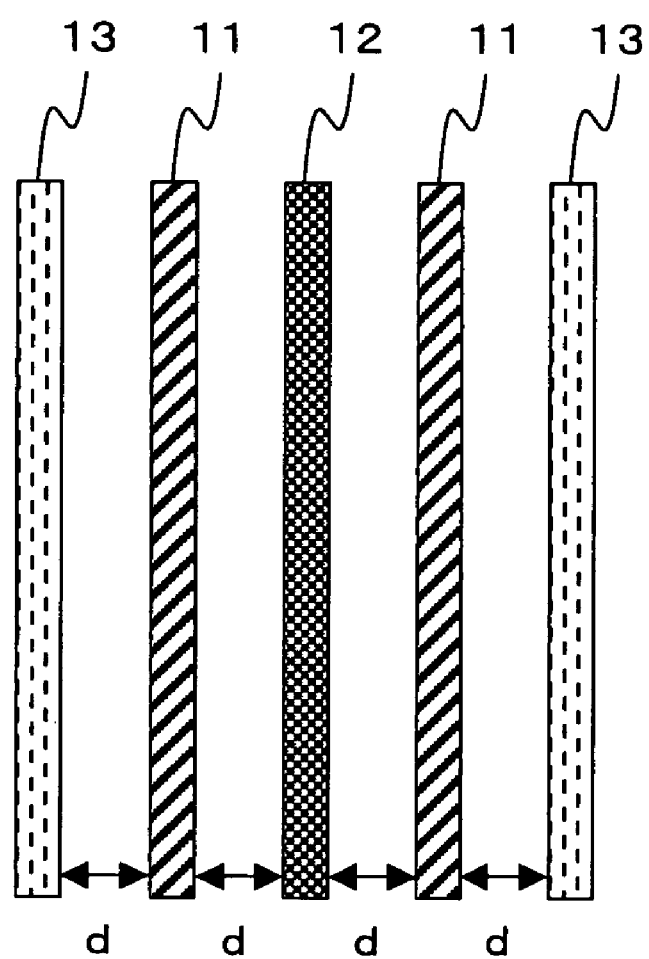
FIG. 1 is a diagram schematically illustrating wiring in a semiconductor integrated circuit device embodying the present invention.

FIG. 1 is a diagram schematically illustrating wiring in a semiconductor integrated circuit device embodying the present invention. As shown in FIG. 1, the semiconductor integrated circuit device includes a first wiring trace 11 to which a prescribed voltage is supplied; a second wiring trace 12 that takes on a voltage that may exceed the prescribed voltage; and a third wiring trace 13 that only takes on a voltage not exceeding the prescribed voltage. Alternatively, the semiconductor integrated circuit device includes a first wiring trace 11 to which a prescribed voltage is supplied; the second wiring trace 12, which takes on a voltage that may fall below the prescribed voltage; and the third wiring trace 13, which only takes on a voltage equal to or greater than the prescribed voltage. The wiring traces are routed at a wiring spacing d in such a manner that the first wiring trace 11 is interposed between the second wiring trace 12 and the third wiring trace 13.

By way of example, if the semiconductor integrated circuit device is implemented by a CMOS circuit, the prescribed voltage is the potential of a ground wire and the wiring trace 11 is a trace at the same potential as that of the ground wire, then the wiring trace 13 will correspond to an ordinary trace and the wiring trace 12 will correspond to a trace that supplies a substrate bias voltage to the back-gate electrode of an NMOS transistor. Further, if the prescribed voltage is the potential of a power-supply line that takes on a positive potential and the wiring trace 11 is a trace at the same potential as that of the power-supply line, then the wiring trace 12 is a trace that supplies a substrate bias voltage to the back-gate electrode of a PMOS transistor and the wiring trace 13 will correspond to an ordinary trace. It should be noted that an ordinary wiring trace refers to a trace other than a power-supply line, ground line and wiring for supplying substrate bias and has a potential equal to or greater than that of the ground line and not exceeding that of the power-supply line.

The semiconductor integrated circuit device having the wiring structure set forth above is wired through steps (A) to (C) below using an automatic routing tool when wiring is performed in the same wiring layer.

(A) The routing of wiring trace 12 is performed.

(B) The wiring trace 11 is routed adjacent the wiring trace 12 at a prescribed wiring spacing d in such a manner that the wiring trace 13 will not be routed between them.

(C) The routing of wiring trace 13 is performed.

In the semiconductor integrated circuit device whose wiring has been routed through the procedure described above, the wiring trace 11 for which the potential difference is known to be small beforehand is routed so as to always be adjacent to the wiring trace 12. Accordingly, the wiring trace 13 for which there is the possibility that the potential difference relative to the wiring trace 12 will become large is never placed directly adjacent the wiring trace 12. As a result of such routing, wiring is implemented in such a manner that the insulation between traces can be sufficiently assured. Further, since such routing can be designed by already existing automatic routing tools and it is unnecessary to perform re-routing with human intervention, there is no increase in the design labor involved in routing.

First Embodiment

Figure 2:
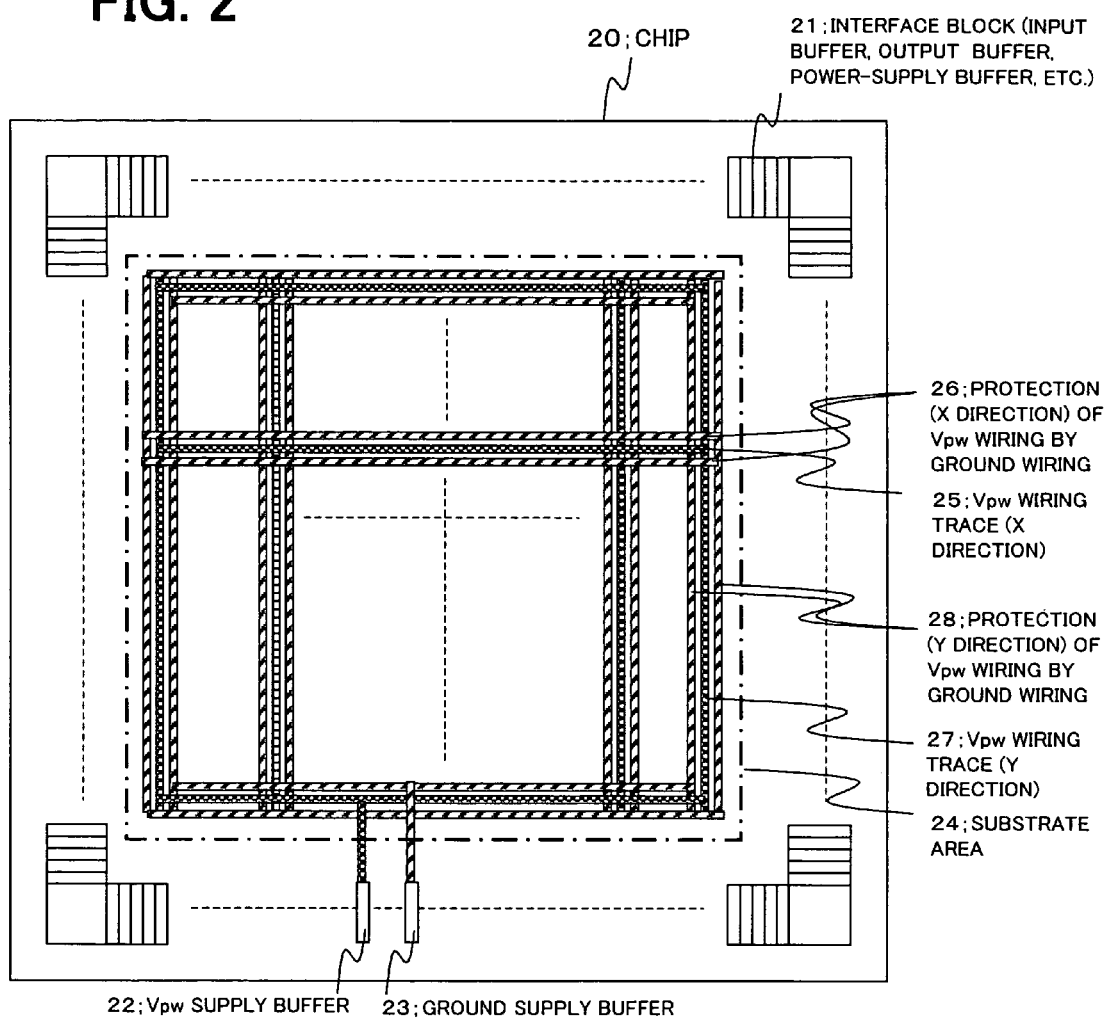
FIG. 2 is a diagram schematically illustrating routing of a semiconductor integrated circuit device according to a first embodiment of the present invention.

FIG. 2 is a diagram schematically illustrating routing of a semiconductor integrated circuit device according to a first embodiment of the present invention. As shown in FIG. 2, a chip 20 has an interface block 21 of an input buffer, output buffer or power-supply buffer at a peripheral portion of the chip. Provided at the central portion of the chip 20 is a substrate area 24 in which wiring for supplying substrate bias voltage is routed. The interface block 21 includes a Vpw supply buffer 22 that externally supplies the back-gate electrode of an NMOS transistor with a substrate bias voltage, and a ground supply buffer 23 that applies a ground voltage. The substrate area 24 is an area in which Vpw wiring traces and ground wiring traces are distributed and routed. In one metal layer (metal wiring layer) within the substrate area 24, a Vpw wiring trace 25 is routed in the horizontal (X) direction, and ground wiring traces 26 for protection are routed adjacent both sides of the Vpw wiring trace 25 in such a manner that other wiring traces will not be routed adjacent these sides. Further, in another metal layer within the substrate area 24, a Vpw wiring trace 27 is routed in the vertical (Y) direction, and ground wiring traces 28 for protection are routed adjacent both sides of the Vpw wiring trace 27 in such a manner that other wiring traces will not be routed adjacent these sides. Further, the Vpw wiring trace 25 and the Vpw wiring trace 27 are connected through a via or the like (not shown) and are wired to the Vpw supply buffer 22. The ground wiring traces 26 and 28 are connected through a via or the like (not shown) and are wired to the ground supply buffer 23.

In the substrate area 24 of the semiconductor integrated circuit device having this structure, wiring traces which might possibly develop a large potential difference relative to the Vpw wiring traces 25 and 27 are not placed directly adjacent the Vpw wiring traces 25, 27 owing to the interposition of the ground wiring traces 26 and 28. Accordingly, routing is implemented in such a manner that the insulation between traces can be sufficiently assured.

Figure 3:
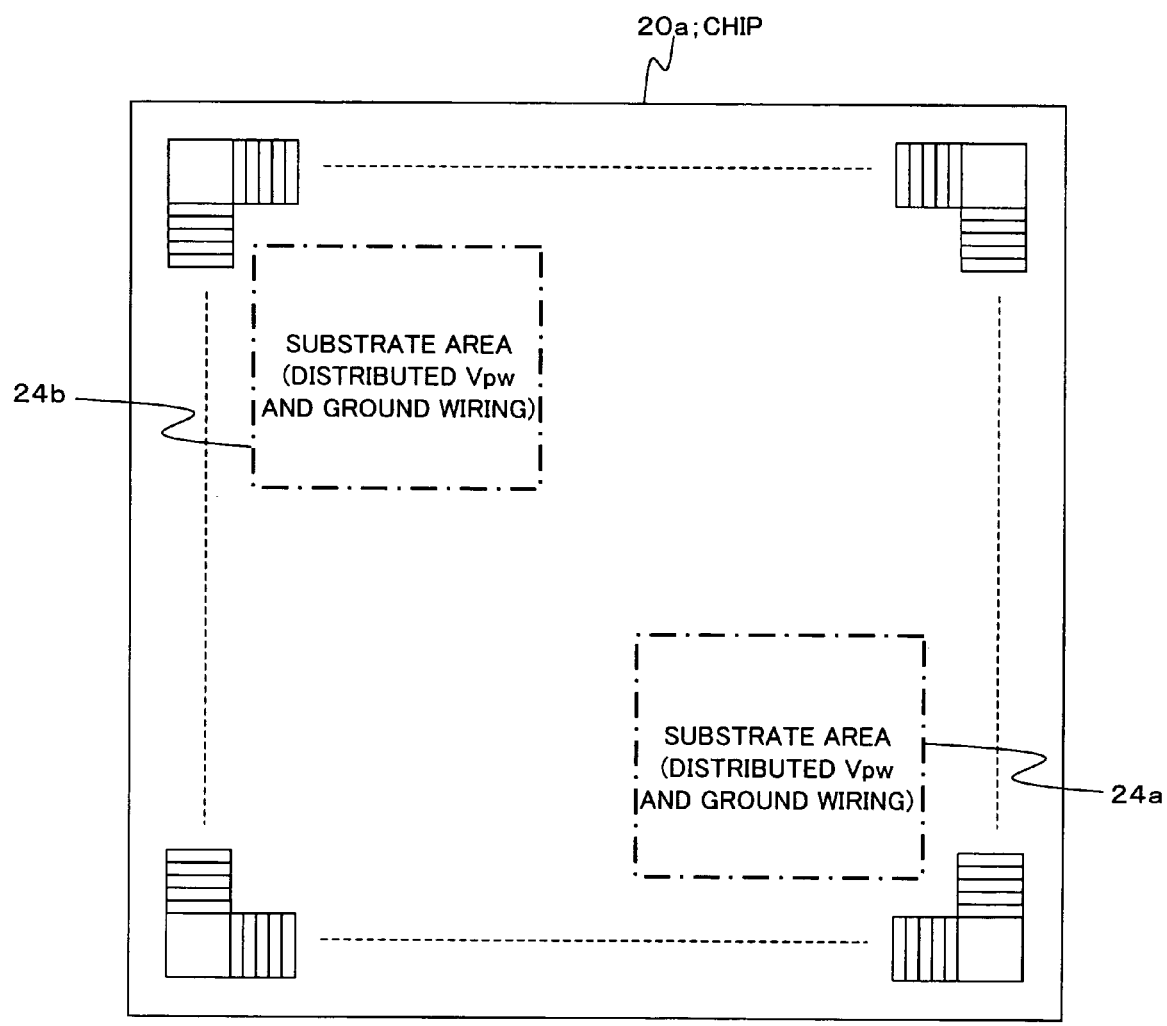
FIG. 3 is a diagram schematically illustrating a semiconductor integrated circuit device having a wiring distribution structure in each of a plurality of substrate areas.

The example illustrated in FIG. 2 presents a wiring distribution structure in the single substrate area 24, which occupies the major portion of the chip 20. However, this arrangement does not impose any limitation. For example, it may be so arranged that wiring distribution structures are formed in each of a plurality of areas in the substrate. FIG. 3 is a diagram schematically illustrating a semiconductor integrated circuit device having a wiring distribution structure in each of a plurality of substrate areas. As shown in FIG. 3, a chip 20a is provided with substrate areas 24a and 24b each having a structure in which Vpw traces and ground traces are distributed. In a manner similar to that of FIG. 2, routing is performed in each area in such a manner that wiring traces which might possibly develop a large potential difference relative to the Vpw wiring traces are not placed directly adjacent the Vpw wiring traces owing to the interposition of the ground wiring traces 26.

In the description rendered above, only a structure in which Vpw and ground traces are distributed is discussed for the sake of simplicity. However, this does not impose a limitation upon the present invention and it is permissible to provide a substrate area in which power-supply traces are routed on both sides of traces that supply substrate bias voltage to the back-gate electrode of a PMOS transistor. This substrate area may be identical with the substrate area described earlier or may be provided differently from the above.

Second Embodiment

Figure 4:
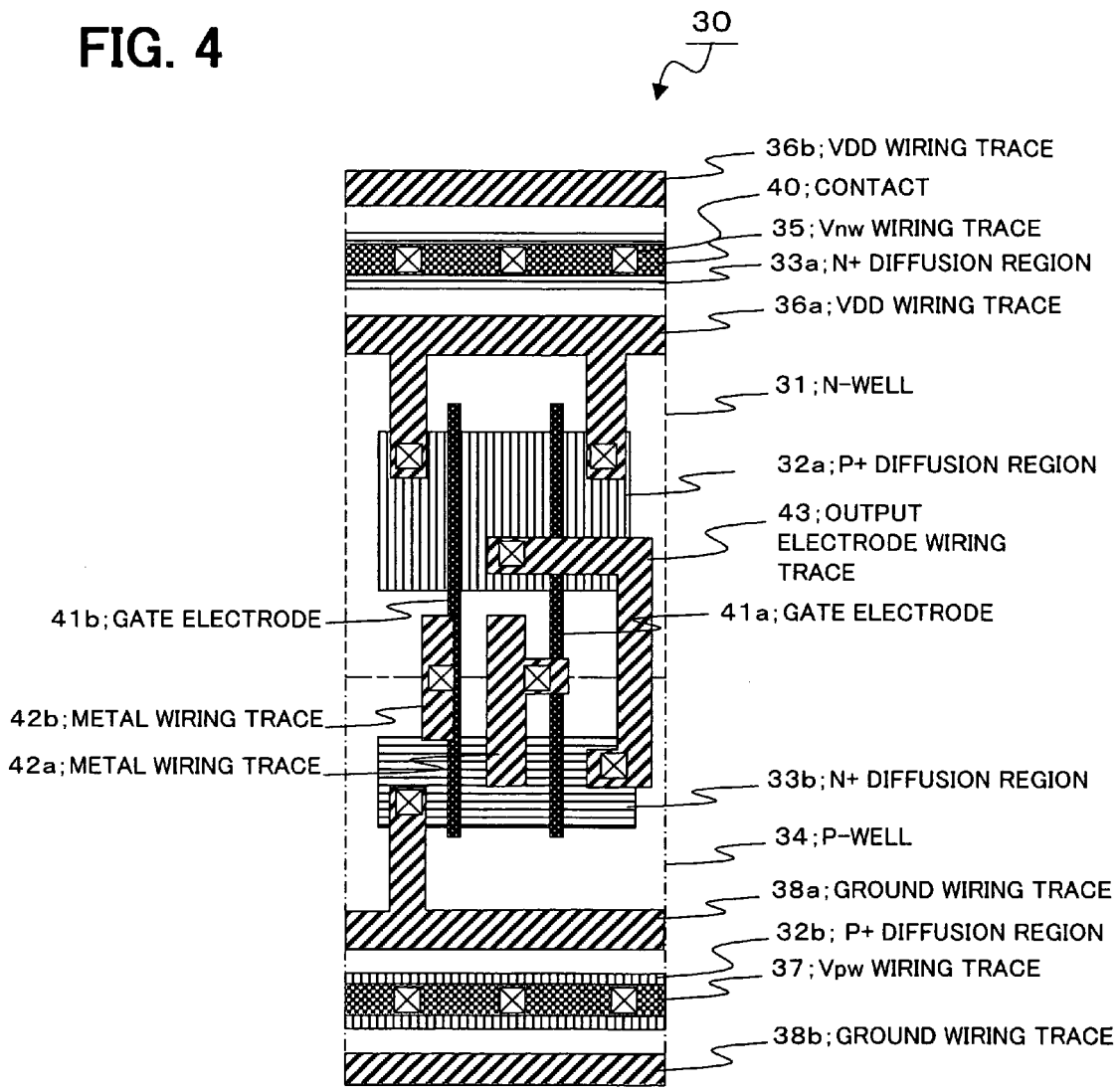
FIG. 4 is a diagram schematically illustrating the structure of a semiconductor integrated circuit device according to a second embodiment of the present invention.

An example in which the invention is applied to routing in a cell-based transistor area will be described next. FIG. 4 is a diagram schematically illustrating the structure of a semiconductor integrated circuit device according to a second embodiment of the present invention. FIG. 4 shows the structure of a standard cell 30 serving as a 2-input NAND gate. The standard cell 30 is supplied with a Vnw wiring trace 35 and a Vpw wiring trace 37 that serve as wiring for control of substrate bias.

The standard cell 30 exists in a structure in which an N-well 31 and a P-well 34 are formed in a semiconductor substrate. A P+ diffusion region 32a and an N+ diffusion region 33a are formed in the N-well 31, and an N+ diffusion region 33b and a P+ diffusion region 32b are formed in the N-well 34. Disposed above the P+ diffusion region 32a and the N+ diffusion region 33b via an insulating layer are a gate electrode 41a of polysilicon or the like connected to metal wiring trace 42a and a gate electrode 41b of polysilicon or the like connected to metal wiring trace 42b. The metal wiring trace 42a and metal wiring trace 42b are the input terminals of the 2-input NAND gate. Routed above the N-well 31 via an insulating layer is a VDD wiring trace 36a connected to the left and right ends of the P+ diffusion region 32a via contacts. Routed above the P-well 34 via an insulating layer is a ground wiring trace 38a connected to the left edge of the N+ diffusion region 33b via a contact. The central portion of the P+ diffusion region 32a bracketed by the gate electrodes 41a and 41b and the right end of the N+ diffusion region 33b are connected by an output electrode trace 43, which forms the output terminal of the 2-input NAND gate.

The power supply of a PMOS-transistor substrate bias, which can exceed the power-supply voltage supplied to the VDD wiring trace 36a, is supplied from the Vnw wiring trace 35 to the N+ diffusion region 33a via a contact 40. This power is applied to the N-well 31. Impressing a voltage (a forward substrate bias) lower than the voltage of the VDD wiring trace 36a upon the Vnw wiring trace 35 makes it easier to pass current through the channel of the transistor constructed in the P+ diffusion region 32a. On the other hand, making the potential of the Vnw wiring trace 35 higher than that of the VDD wiring trace 36a applies a reverse substrate bias to the N-well 31 and reduces leakage of current when the transistor is non-operational.

On the other hand, the power supply of an NMOS-transistor substrate bias, which can fall below the power-supply voltage supplied to the ground wiring trace 38a, is supplied from the Vpw wiring trace 37 to the P+ diffusion region 32b via contact 40. This power is applied to the P-well 34. Placing the Vpw wiring trace 37 and the ground wiring trace 38a at the same potential applies substrate bias in the forward direction and makes it easier to pass current through the channel of the transistor when the transistor constructed in the N+ diffusion region 33b operates. On the other hand, making the potential of the Vpw wiring trace 37 lower than that of the ground wiring trace 38a applies substrate bias to the P-well 34 and reduces leakage of current when the transistor is non-operational.

The VDD wiring trace 36a and a VDD wiring trace 36b are disposed adjacent respective sides of the Vnw wiring trace 35. Further, ground wiring traces 38a and 38b are disposed adjacent respective sides of the Vpw wiring trace 37.

In the standard cell 30 constructed as set forth above, wiring traces which might possibly develop a large potential difference relative to the Vnw wiring trace 35 are not placed directly adjacent the Vnw wiring trace 35 owing to the interposition of the VDD wiring traces 36a and 36b. Further, wiring traces which might possibly develop a large potential difference relative to the Vpw wiring trace 37 are not placed directly adjacent the Vpw wiring trace 37 owing to the interposition of the ground wiring traces 38a and 38b. Accordingly, with regard to the Vnw wiring trace 35 and Vpw wiring trace 37, which are traces for controlling substrate bias, routing is performed in such a manner that insulation between the wiring traces can be sufficiently assured.

Figure 5:
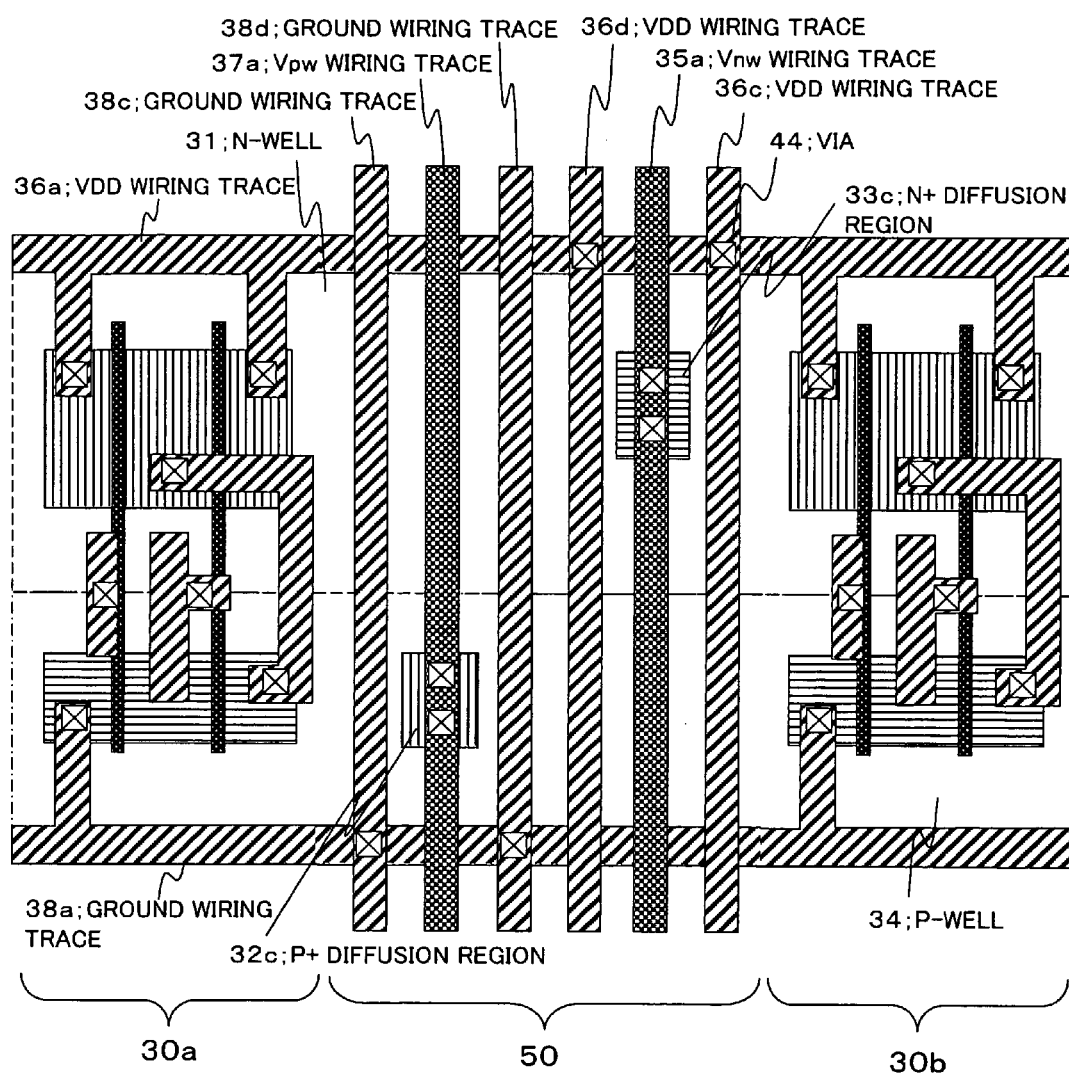
FIG. 5 is a diagram schematically illustrating another structure of a semiconductor integrated circuit device according to a second embodiment of the present invention.
Figure 6:
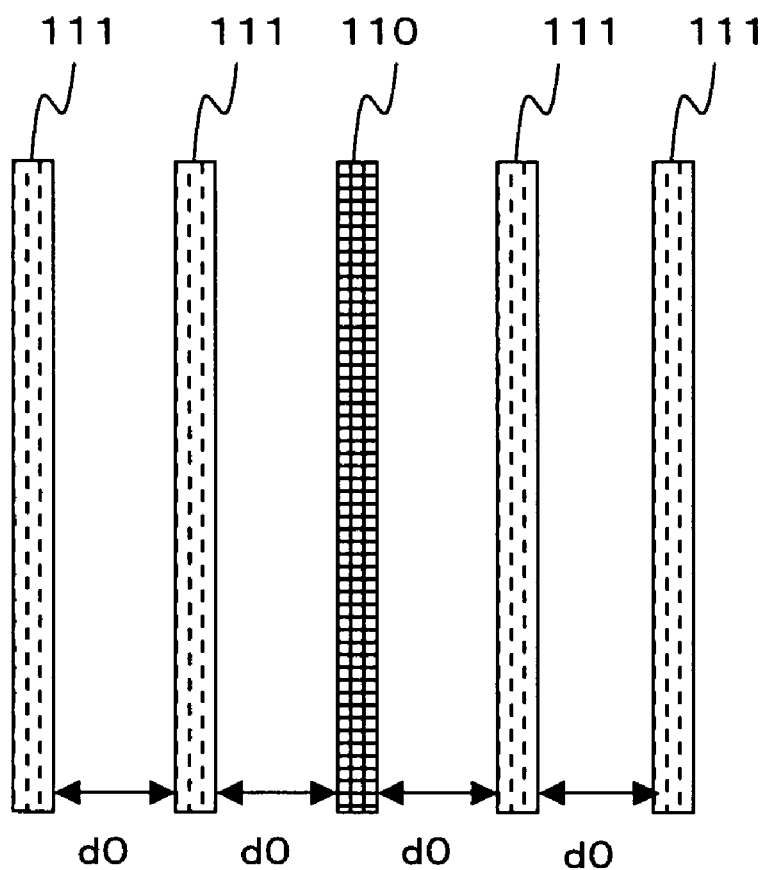
FIG. 6 is a diagram schematically illustrating wiring in a semiconductor integrated circuit device according to the prior art.
Figure 7:
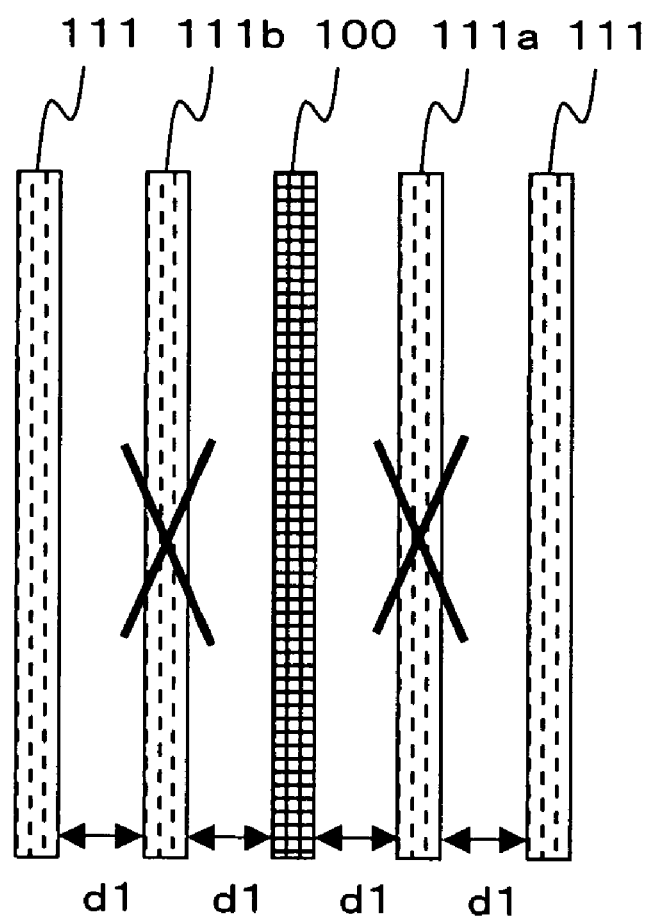
FIG. 7 is another diagram schematically illustrating wiring in a semiconductor integrated circuit device according to the prior art.

Described next will be another example in which the invention is applied to routing in a cell-based transistor. FIG. 5 is a diagram schematically illustrating another structure of a semiconductor integrated circuit device according to a second embodiment of the present invention. As shown in FIG. 5, a cell 50 for supplying power is disposed between a standard cell 30a and a standard cell 30b. The standard cells 30a, 30b have structures identical with that of the standard cell 30 of FIG. 4 except for deletion of the Vnw wiring trace 35, VDD wiring trace 36b, Vpw wiring trace 37, ground wiring trace 38b, N+ diffusion region 33a and P+ diffusion region 32b.

In the cell 50 for supplying power, a Vnw wiring trace 35a is bracketed (sandwiched) on both sides by adjoining VDD wiring traces 36c, 36d and is wired over a VDD wiring trace 36a, via an insulating layer, at right angles to the VDD wiring trace 36a. Further, the Vnw wiring trace 35a is connected via a contact to an N+ diffusion region 33c formed in the N-well 31 and supplies the N-well 31 with a positive substrate bias voltage. It should be noted that the VDD wiring traces 36c, 36d are connected to the VDD wiring trace 36a through vias.

A Vpw wiring trace 37a is bracketed on both sides by adjoining ground wiring traces 38c, 38d and is wired over a ground wiring trace 38a, via an insulating layer, at right angles to the VDD wiring trace 38a. Further, the Vpw wiring trace 37a is connected via a contact to a P+diffusion region 32c formed in the P-well 34 and supplies the P-well 34 with a negative substrate bias voltage. It should be noted that the ground wiring traces 38c, 38d are connected to the ground wiring trace 38a through vias.

In the cell 50 for supplying power constructed as set forth above, and in a manner similar to that of FIG. 4, wiring traces which might possibly develop a large potential difference relative to the Vnw wiring trace 35a are not placed directly adjacent the Vnw wiring trace 35a owing to the interposition of the VDD wiring traces 36c and 36d. Further, wiring traces which might possibly develop a large potential difference relative to the Vpw wiring trace 37a are not placed directly adjacent the Vpw wiring trace 37a owing to the interposition of the ground wiring traces 38c and 38d. Accordingly, with regard to the Vnw wiring trace 35a and Vpw wiring trace 37a, which are traces for controlling substrate bias, routing is performed in such a manner that insulation between the wiring traces can be sufficiently assured.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device, comprising:
   a plurality of first wiring traces to which a prescribed voltage is supplied;
   a plurality of second wiring traces configured to take on a voltage that exceeds the prescribed voltage; and
   a plurality of third wiring traces configured to take on a voltage not exceeding the prescribed voltage;
   wherein said pluralities of first, second, and third wiring traces are routed to interpose said plurality of first wiring traces between said each of said plurality of second traces and said plurality of third wiring traces in a same wiring layer of said semiconductor integrated circuit device, and
   wherein said plurality of second wiring traces are disposed so as to be sandwiched by respective ones of said plurality of first wiring traces adjacent to both sides of a respective one of the plurality of second wiring traces.

2. A semiconductor integrated circuit device in which wiring traces are routed in such a manner that said first wiring trace is interposed in the entirety of a wiring area of the semiconductor integrated circuit device set forth in claim 1.

3. A semiconductor integrated circuit device in which wiring traces are routed in such a manner that said first wiring trace is interposed in each of a plurality of wiring areas in the semiconductor integrated circuit device set forth in claim 1.

4. A CMOS circuit comprising the semiconductor device as recited in claim 1.

5. A CMOS circuit as recited in claim 4, wherein the prescribed voltage comprises a potential of a power-supply wire.

6. A CMOS circuit as recited in claim 5, wherein the plurality of second traces comprise traces that each supply a substrate bias voltage to a back-gate electrode of a PMOS transistor.

7. A CMOS circuit as recited in claim 5, wherein the third trace comprises an ordinary wiring trace.

8. A semiconductor integrated circuit device as recited in claim 1, wherein the third wiring trace comprises a plurality of third wiring traces, and
   wherein each of said pluralities of second and third wiring traces is routed to not be adjacent to another one of said plurality of second and third wiring traces.

9. A cell-based transistor circuit comprising the semiconductor integrated circuit device as recited in claim 1.

10. A cell for supplying power comprising the semiconductor integrated circuit device as recited in claim 1.

11. A semiconductor integrated circuit device, comprising:
    a plurality of first wiring traces to which a prescribed voltage is supplied;
    a plurality of second wiring traces configured to take on a voltage equal to or greater than the prescribed voltage; and
    a plurality of third wiring traces configured to take on a voltage that falls below the prescribed voltage;
    wherein said first plurality of wiring traces are routed to be interposed between each of the plurality of said second wiring traces and said plurality of third wiring traces in a same wiring layer of the semiconductor integrated circuit device, and
    wherein said plurality of third wiring traces are disposed so as to be sandwiched by respective ones of said plurality of first wiring traces adjacent to both sides of respective ones of the plurality of third wiring traces.

12. A semiconductor integrated circuit device in which wiring traces are routed in such a manner that said first wiring trace is interposed in the entirety of a wiring area of the semiconductor integrated circuit device set forth in claim 11.

13. A semiconductor integrated circuit device in which wiring traces are routed in such a manner that said first wiring trace is interposed in each of a plurality of wiring areas in the semiconductor integrated circuit device set forth in claim 11.

14. A CMOS circuit comprising the semiconductor device as recited in claim 11.

15. A CMOS circuit as recited in claim 14, wherein the prescribed voltage comprises a potential of a ground line.

16. A CMOS circuit as recited in claim 14, wherein the plurality of third traces comprise traces that each supply a substrate bias voltage to a back-gate electrode of an NMOS transistor.

17. A CMOS circuit as recited in claim 14, wherein the second trace comprises an ordinary wiring trace.

18. A semiconductor integrated circuit device, comprising:
    a first wiring trace to which a first voltage is supplied;
    a second wiring trace to which a second voltage is supplied;
    a third wiring trace configured to take on a range of voltages not exceeding the first voltage and equal to or greater than the second voltage;
    a fourth wiring trace configured to take a voltage that exceeds the first voltage; and
    a fifth wiring trace configured to take a voltage that falls below the second voltage;
    said first wiring trace being interposed between said third and fourth wiring traces and said second wiring trace being interposed between said third and fifth wiring traces in a same wiring layer.

19. The device according to claim 18, wherein said first and second wiring traces are first and second power-supply wiring traces, respectively, and wherein said fourth and fifth wiring traces comprise first and second substrate-potential wiring traces, respectively.

20. A semiconductor integrated circuit device in which said first wiring traces are interposed in the entirety of a wiring area and said second wiring traces are interposed in the entirety of the wiring area, respectively, of the semiconductor integrated circuit device set forth in claim 18.

21. A semiconductor integrated circuit device in which said first wiring traces are interposed in each of a plurality of wiring areas and said second wiring traces are interposed in each of a plurality of wiring areas, respectively, in the semiconductor integrated circuit device set forth in claim 18.

* * * * *